US012761305B2

(12) United States Patent
Feiweier et al.

(10) Patent No.: US 12,761,305 B2
(45) Date of Patent: Oct. 13, 2026

(54) ECHO PLANAR SLICE MULTIPLEXING

(71) Applicant: Siemens Healthineers AG, Forchheim (DE)

(72) Inventors: Thorsten Feiweier, Poxdorf (DE); Mario Zeller, Erlangen (DE); Adam Kettinger, Erlangen (DE); Michael Köhler, Nuremberg (DE); Max Müller, Erlangen (DE)

(73) Assignee: Siemens Healthineers AG, Forchheim (DE)

(*) Notice: Subject to any disclaimer, the term of this patent is extended or adjusted under 35 U.S.C. 154(b) by 185 days.

(21) Appl. No.: 18/664,645

(22) Filed: May 15, 2024

(65) Prior Publication Data

US 2024/0385271 A1 Nov. 21, 2024

(30) Foreign Application Priority Data

May 17, 2023 (DE) ..................... 10 2023 204 641.5

(51) Int. Cl.
*G01V 3/00* (2006.01)
*G01R 33/483* (2006.01)
(Continued)

(52) U.S. Cl.
CPC ..... *G01R 33/5616* (2013.01); *G01R 33/4835* (2013.01); *G01R 33/5611* (2013.01); *G01R 33/56554* (2013.01)

(58) Field of Classification Search
CPC ............ G01R 33/5616; G01R 33/4835; G01R 33/5611; G01R 33/56554
(Continued)

(56) References Cited

U.S. PATENT DOCUMENTS 6,043,651 A 3/2000 Heid
6,794,867 B1 * 9/2004 Block ................ G01R 33/5613 324/309
(Continued)

FOREIGN PATENT DOCUMENTS

DE 102016200889 B4 2/2018
DE 102016218955 A1 4/2018
(Continued)

OTHER PUBLICATIONS

Zahneisen, Benjamin et al. "Three-Dimensional Fourier Encoding of Simultaneously Excited Slices: Generalized Acquisition and Reconstruction Framework," Magnetic Resonance in Medicine, vol. 71, No. 6, pp. 2071-2081, Jun. 2014 // https://doi.org/10.1002/mrm.24875.
(Continued)

*Primary Examiner* — Walter L Lindsay, Jr.
*Assistant Examiner* — Frederick Wenderoth
(74) *Attorney, Agent, or Firm* — Banner & Witcoff, Ltd.

(57) ABSTRACT

Method for separating measurement data of an examination object, which data was acquired in collapsed form simultaneously for slices using an EPI SMS technique, into measurement data of individual slices, first and second sets of reference measurement data for separating the measurement data are acquired for each of the slices using a GRE acquisition technique, wherein the reference measurement data in the first set is acquired during switching of readout gradients of a first polarity, and the reference measurement data in the second set is acquired during switching of readout gradients of a second polarity. Based on the two sets of reference measurement data, corresponding separate first calibration data is determined from the reference measurement data acquired using a GRE acquisition technique while switching readout gradients of a first polarity, and second
(Continued)

calibration data is determined from the reference measurement data acquired while switching readout gradients of a second polarity.

15 Claims, 4 Drawing Sheets

(51) Int. Cl.
*G01R 33/561* (2006.01)
*G01R 33/565* (2006.01)

(58) Field of Classification Search
USPC .......................................................... 324/309
See application file for complete search history.

(56) References Cited

U.S. PATENT DOCUMENTS

| | | | | |
|---|---|---|---|---|
| 9,329,254 | B2 | 5/2016 | Pfeuffer | |
| 2013/0018252 | A1 * | 1/2013 | Irarrazaval ....... | G01R 33/56316 600/410 |
| 2013/0069648 | A1 * | 3/2013 | Grodzki ................. | G01R 33/56 324/309 |
| 2017/0038450 | A1 * | 2/2017 | Hoge ................. | G01R 33/4835 |
| 2017/0212196 | A1 | 7/2017 | Feiweier et al. | |
| 2018/0095150 | A1 | 4/2018 | Zeller | |
| 2018/0356488 | A1 | 12/2018 | Zeller | |
| 2020/0103484 | A1 * | 4/2020 | Zeller ................ | G01R 33/4835 |

FOREIGN PATENT DOCUMENTS

| | | | | |
|---|---|---|---|---|
| DE | 102017209988 | B3 | 6/2018 | |
| DE | 102018216774 | A1 | 4/2020 | |
| EP | 3462205 | A1 * | 4/2019 | ........... G01R 33/543 |

OTHER PUBLICATIONS

Setsompop, Kawin, et al. "Blipped?controlled aliasing in parallel imaging for simultaneous multislice echo planar imaging with reduced g?factor penalty." Magnetic resonance in medicine 67.5 (2012): 1210-1224.; 2012.
Polimeni, Jonathan R. et al. "Reducing Sensitivity Losses Due to Respiration and Motion in Accelerated Echo Planar Imaging by Reordering the Autocalibration Data Acquisition" Magnetic Resonance in Medicine; vol. 75; pp. 665-679; 2016.
Breuer, Felix A. et al., "Controlled Aliasing in Parallel Imaging Results in Higher Acceleration (CAIPIRINHA) for Multi-Slice Imaging", Magnetic Resonance in Medicine; vol. 53; pp. 684-691; 2005.
Hoge W. Scott, et al. "Dual-Polarity GRAPPA for Simultaneous Reconstruction and Ghost Correction of Echo Planar Imaging Data" Magnetic Resonance in Medicine, 2016, 76:32-44, 32 pages; 2016.
Pruessmann K. et al., "SENSE: Sensitivity Encoding for Fast MRI", Magnetic Resonance in Medicine 42:952-962 (1999).

* cited by examiner

ECHO PLANAR SLICE MULTIPLEXING

TECHNICAL FIELD

The disclosure relates to a method and to a magnetic resonance system for improving echo planar slice multiplexing techniques, in particular for improving the separation of measurement data of an object under examination (U), which measurement data was acquired in collapsed form simultaneously for at least two slices by means of an echo planar (EPI) simultaneous multi-slice (SMS) technique, into measurement data of individual slices.

BACKGROUND

Magnetic resonance technology (the abbreviation MR is used below for magnetic resonance) is a known technology that can be used to generate images of the inside of an object under examination. In simple terms, this is done by placing the object under examination in a magnetic resonance apparatus in a comparatively strong static, homogeneous main magnetic field, also called the $B_0$ field, at field strengths of 0.2 tesla to 7 tesla and higher, with the result that the nuclear spins of the object are oriented along the main magnetic field. Radio frequency excitation pulses (RF pulses) are applied to the object under examination in order to induce nuclear spin resonances measurable as signals. The induced nuclear spin resonances are measured as what is known as k-space data, and this data is used as the basis for reconstructing MR images or obtaining spectroscopic data. Rapidly switched gradient magnetic fields, called gradients for short, are superimposed on the main magnetic field for spatial encoding of the measurement data. A scheme used to specify a succession over time of RF pulses to be applied and gradients to be switched is called a pulse sequence (scheme), or sequence for short. The recorded measurement data is digitized and stored as complex numerical values in a k-space matrix. A multidimensional Fourier transform, for example, can be used to reconstruct an associated MR image from the k-space matrix, which is populated with values.

One of the fastest known MR acquisition techniques is called echo planar imaging (EPI), in which, after an RF excitation pulse, an oscillating, i.e., bipolar, readout gradient is deployed, which, with every change in polarity of the gradient, refocuses the transverse magnetization as far as the T2* relaxation allows, each time generating a gradient echo. In other words, the switching of the bipolar readout gradient after an RF excitation pulse, for example, within the free induction decay (FID) after the excitation, or, if an RF refocusing pulse is additionally applied after the RF excitation pulse, within the thereby generated spin echo, generates an echo train of rising and falling gradient echoes of alternating sign in the readout direction. EPI pulse sequences can be deployed as “single-shot” methods, in which all the measurement data for generating an image of a subvolume, for example, of a slice, of the object under examination is acquired after just one RF excitation pulse.

As a result of the alternating polarity of the readout gradient, the measurement data obtained from the gradient echo signals must fill a raw-data k-space matrix in such a way that the filling direction alternates from row to row of the raw-data k-space matrix. If even slight deviations appear from row to row, for instance, caused by delays in the gradient switching or eddy currents, this results in what is known as N/2 ghosts, i.e., given an image matrix of N×N points. In that case, the actual image is redisplayed, shifted by N/2 in the positive and negative direction with respect to the center of the image matrix, generally with a different intensity. In order to correct such N/2 ghosts, it is known from U.S. Pat. No. 6,043,651, for instance, to acquire three navigator signals while switching a bipolar readout gradient, which navigator signals can be used to perform a correction of zero-order and first-order phase shifts between gradient echoes acquired with different polarity in the readout direction, which can correct such shifts. This is done by using correlation of the acquired navigator signals in the image domain in order to determine correction factors, which are used in reconstructing image data from the gradient echoes acquired as measurement data in a raw-data k-space matrix in order to correct the aforementioned shif, ts in the raw-data k-space matrix. The appearance of the ghosts can depend here on a chosen undersampling. Using an undersampling factor PAT=2, i.e., actually acquiring half the measurement data that should be acquired based on Nyquist, leads to asymmetries, for example, to N/4 ghosts.

U.S. Pat. No. 9,329,254B2, for example, discloses a further phase correction method known as DORK for correcting shifts caused by variations over time in a main magnetic field applied during an EPI measurement, for instance, by drift. In this method, a navigator signal is acquired. It is usual in a DORK correction of this type to perform averaging over an entire image volume.

The desire for ever-faster MR acquisitions in the clinical environment is leading to a renaissance in methods in which images of a plurality of slices are acquired simultaneously. These methods can be characterized generally by the targeted use of transverse magnetization of at least two slices simultaneously for the imaging process, at least during part of the measurement (“multi-slice imaging,” “slice multiplexing”). In contrast, in the established form of “multislice imaging,” the signal is acquired from at least two slices alternately, i.e., fully independently of one another, with a correspondingly longer measurement time.

Known examples of such methods, also called simultaneous multi-slice (SMS) methods, are Hadamard encoding, methods that use simultaneous echo refocusing, methods that use wide-band data acquisition, or methods that employ parallel imaging in the slice direction. The last-mentioned methods include, for example, also the CAIPIRINHA technique, as described by Breuer et al. in “Controlled aliasing in parallel imaging results in higher acceleration (CAIPIRINHA) for multi-slice imaging,” Magnetic Resonance in Medicine 53, 2005, pages 684-691, and the blipped CAIPIRINHA technique, as described by Setsompop et al. in “Blipped-controlled aliasing in parallel imaging for simultaneous multislice echo planar imaging with reduced g-factor penalty,” Magnetic Resonance in Medicine 67, 2012, pages 1210-1224.

In particular, the last-mentioned slice multiplexing methods use what is known as a multiband RF pulse in order to excite or otherwise manipulate, e.g., refocus or saturate, two or more slices simultaneously. Such a multiband RF pulse is, for instance, a multiplex of individual RF pulses that would be used to manipulate the individual slices to be manipulated simultaneously. The multiplexing results in, for example, a baseband-modulated multiband RF pulse from adding the pulse waveforms of the individual RF pulses. The spatial encoding of the acquired signals is achieved here essentially by conventional gradient switching in two directions (two-dimensional gradient encoding) or, for instance, in multi-slab techniques, also in three directions (three-dimensional gradient encoding).

In particular in the EPI environment, for example, for functional acquisitions (functional magnetic resonance imaging), for determining diffusion properties as part of diffusion-weighted imaging (DWI), or for perfusion measurements, this approach can be used to reduce the required measurement time in clinical use typically by a factor of 2-4.

The resultant signals are acquired by means of a plurality of receive antennas from all the excited slices in collapsed form in one dataset and then separated according to the individual slices, for instance, using parallel acquisition techniques.

The algorithms that can be used to re-separate and allocate to the individual slices the acquired signals are based on the availability of further information ("reference measurement data"), from which the spatial sensitivity of the receive antennas (sensitivity data) can be determined. Such sensitivity data is used, in addition to the spatial encoding by the gradient fields, as additional spatial encoding, by means of which the required signal allocation is performed by solving equation systems, by means of iterative methods, or using trained networks.

Said parallel acquisition techniques (ppa techniques), which, by incomplete sampling in terms of Nyquist, i.e., undersampling, of k-space can be used to shorten acquisition times already generally needed to acquire the desired data, include, for example, GRAPPA ("GeneRalized Autocalibrating Partially Parallel Acquisition") and SENSE ("SENSitivity Encoding"). In parallel acquisition techniques, the measurement points in k-space that are not measured in the undersampling are usually evenly distributed over the k-space to be measured under Nyquist, with the result that, for instance, every second k-space line is measured. In addition, the "missing" k-space data in parallel acquisition techniques is reconstructed using coil sensitivity data. This coil sensitivity data for the receive coils used in the acquisition of the measurement data is determined from reference measurement data, which samples fully according to the Nyquist criterion at least a region of k-space to be measured, usually the central region.

In slice multiplexing methods, parallel acquisition techniques can be used in order to re-separate the measurement data acquired simultaneously, and hence in collapsed form, for different slices. This requires reference measurement data to be acquired for all the slices concerned. This is usually done as part of a reference measurement, which has to be performed additionally and which measures the reference measurement data separately for each required slice.

In order to be able to separate the resultant signals obtained from the different slices, for example a different phase is applied to each of the individual RF pulses before the multiplexing. This can be done, for instance, by adding a phase, which increases linearly (e.g., with the k-space coordinate in the phase-encoding direction ($k_y$)). A different phase gradient can hence be applied to each slice, thereby shifting the slices in the image domain with respect to one another. This shift is controlled by what is called the FoV shift factor (field of view shift factor). For example, DE102016218955 describes how an optimum FOV shift factor can be determined.

In the CAIPIRINHA technique described in the cited articles by Breuer et al. and Setsompop et al., alternating additional phase shifts are applied between the simultaneously excited slices by switching additional gradient blips or by additional phase modulation of the RF pulses of the multiband RF pulses, which phase shifts produce shifts in the image domain in the slice direction ("interslice FOV shifts"). The additional shifts in the image domain improve the quality of the separation of the signals obtained from the slices, in particular, if the coil sensitivities exhibit such small differences in the sensitivity profiles of the individual coils used that they are inadequate for reliable separation of the slices. Artifacts are thereby reduced in the image data ultimately reconstructed from the measured measurement data.

The effect of the additional phase shifts on the sampling pattern of a two-dimensional (2D) slice multiplexing measurement can be described as follows. The additional phases that are applied in CAIPIRNHA slice multiplexing methods shift the measurement points exposed to the additional phase by an offset in k-space in the kz-direction. The size of this offset in the kz-direction depends on the applied phase. This is described, for example, in the article by Zahneisen et al.: "Three-dimensional Fourier encoding of simultaneously excited slices: generalized acquisition and reconstruction framework," Magn. Reson. Med. 71, pages 2071-2081 (2014).

The reference measurement data, from which sensitivity data is obtained for separating the simultaneously acquired slices (slice-separation reference measurement data), must normally be measured additionally for each slice multiplexing measurement.

It is apparent, however, that the quality of the images reconstructed from measurement data separated into individual-slice data in this way can depend heavily on an achieved consistency between the reference measurement data and the measured imaging data. If, in order to save time or for robustness to physiological effects (for example, patient movement, breathing, or heartbeat), it is required to use for acquiring the reference measurement data an imaging method other than that for acquiring the imaging data (another type of sequence), this can lead to a reduction in the image quality, which can manifest itself, for example, as increased noise or incomplete unfolding (separation) of the simultaneously excited slices.

It is known, for example, to acquire reference measurement data by means of a single-shot EPI acquisition technique, in which, for each slice for which image data is meant to be generated by a slice multiplexing technique, reference measurement data is acquired by means of an EPI acquisition technique using a single excitation. In this process, the contrast of the reference measurement data can differ from a corresponding contrast of the measurement data acquired for the imaging, for instance, because a shorter repetition time TR was selected for acquiring the reference measurement data than for acquiring the measurement data for the imaging in order to reduce the length of measurement time needed to acquire the reference measurement data.

Such reference measurement data that, like the measurement data for the imaging, is acquired by means of an EPI acquisition technique, has high consistency with the measurement data acquired for the imaging and is relatively robust to effects caused by (physiological) movements, but (even when shorter repetition times are selected) the measurement times for the reference measurement data are relatively high, in particular, because fat suppression modules have to be used. The quality of such reference measurement data acquired using a single-shot EPI acquisition technique is unfortunately still severely reduced by distortions due to inhomogeneities in the main magnetic field B0 and by possible residual fat signals, both having a negative impact on separation (slice unfolding) of the imaging measurement data into individual-slice data, which separation is to be performed using the reference measurement data.

It is also known to acquire reference measurement data by means of a multi-shot EPI acquisition technique, in which, for each slice for which image data is meant to be generated by a slice multiplexing technique, reference measurement data is acquired by multiple excitations in a segmented EPI acquisition technique. Reference measurement data for each of the segments into which the k-space to be acquired is divided can be acquired after a longer relaxation time at a larger time interval so that the reference measurement data from all the segments then implicitly has a comparable contrast. It is also possible to acquire the reference measurement data of the respective segments, into which is divided the k-space to be acquired, at a shorter time interval, but with flip angles used in the excitations for acquiring the reference measurement data varied between the segments, in order to achieve a similar contrast of the reference measurement data for each of the individual segments, for example as is done in what is known as the FLEET technique (FLEET: fast low-angle excitation echo planar technique), which is described, for example, in the article by Polimeni et al. "Reducing sensitivity losses due to respiration and motion in accelerated echo planar imaging by reordering the autocalibration data acquisition", Magn. Reson. Med. 75, pages 665-679, 2016.

Such reference measurement data that, like the measurement data for the imaging, is acquired by means of an EPI acquisition technique, has high consistency with the measurement data acquired for the imaging, and is relatively robust (when using a FLEET technique) to effects caused by (physiological) movements. In contrast, the use of a multi-shot technique allows greater flexibility in the choice of resolution of the reference measurement data compared with in a single-shot technique. However, again, in this case, the measurement times for the reference measurement data are relatively high, in particular, because, again, fat suppression modules have to be used. The quality of such reference measurement data acquired by means of a multi-shot EPI acquisition technique is unfortunately still severely reduced by distortions due to inhomogeneities in the main magnetic field B0 and by possible residual fat signals, both having a negative impact on separation (slice unfolding) of the imaging measurement data into individual-slice data, which separation is to be performed using the reference measurement data. If the reference measurement data of each of the segments into which the k-space to be acquired is divided is acquired after a longer relaxation time at a larger time interval in order to achieve a comparable contrast of the reference measurement data between each of the segments. In that case, the reference measurement data has an unwanted sensitivity to effects of (physiological) movement. When using a FLEET technique, unwanted variations in contrast according to the tissue type being examined can remain between the segments.

It is also known to acquire reference measurement data by means of a gradient echo (GRE) acquisition technique, in which, for each slice for which image data is meant to be generated by a slice multiplexing technique, the reference measurement data is acquired by multiple excitations in a GRE measurement using a fixed polarity of the respective readout gradients, with one gradient echo being acquired with suitable phase encoding after each excitation.

Acquisitions of reference measurement data by means of a GRE acquisition technique are possible in particularly short measurement times and allow a high degree of flexibility in the choice of resolution of the reference measurement data. Reference measurement data acquired in this manner by a GRE acquisition technique is relatively robust to effects of (physiological) movement, is insensitive to inhomogeneities in the main magnetic field B0, and can be used not only for the slice unfolding but is also suitable as reference measurement data for completing unmeasured measurement data for the imaging as part of what may be an additional in-plane parallel acquisition technique such as GRAPPA, which is applied within the individual slices. The fact that the acquisition technique for acquiring the reference measurement data (GRE acquisition technique) differs from that for acquiring the measurement data for the imaging (EPI acquisition technique) means, however, that the reference measurement data is less consistent with the measurement data for the imaging.

SUMMARY

It is desirable to improve the image quality of images acquired by means of a slice multiplexing technique while ensuring that the acquisition of the reference measurement data continues to save time and/or be robust.

An object of the aspects of the disclosure is to reduce the aforementioned problems and, in particular, to make it possible to improve the image quality of images acquired by means of a slice multiplexing technique in an acquisition of reference measurement data that simultaneously saves measurement time and/or is robust to physiological effects of an object under examination.

The object is achieved by a method as claimed in claim 1 for separating measurement data of an object under examination, which data was acquired in collapsed form simultaneously for at least two slices by means of an echo planar (EPI) simultaneous multi-slice (SMS) technique, into measurement data of individual slices.

A method according to the disclosure for separating measurement data of an object under examination, which data was acquired in collapsed form simultaneously for at least two slices by means of an EPI SMS technique, into measurement data of individual slices, comprises the steps:

- loading measurement data to be separated which was generated by generating a train of at least two echo signals from at least two different slices of the object under examination after one RF excitation pulse, and by acquiring the echo signals while switching readout gradients of alternating polarity for consecutive echo signals, and by capturing as the measurement data the echo signals acquired simultaneously for the at least two slices;
- for each of the at least two slices, acquiring by means of a gradient echo (GRE) acquisition technique a first set of reference measurement data for separating the measurement data, wherein the reference measurement data in the first set of reference measurement data is acquired after a plurality of excitations having different phase encoding and in each case during switching of identically shaped readout gradients, which have a first polarity;
- for each of the at least two slices, acquiring by means of a GRE acquisition technique a second set of reference measurement data for separating the measurement data, wherein the reference measurement data in the second set of reference measurement data is acquired after a plurality of excitations having different phase encoding and in each case during switching of identically shaped readout gradients, which have a second polarity, which differs from the first polarity;
- determining first calibration data on the basis of acquired first sets of reference measurement data;
- determining second calibration data on the basis of acquired second sets of reference measurement data;

applying the first calibration data in order to separate into first measurement data of individual slices the measurement data captured in collapsed form that was acquired using readout gradients of the first polarity;

applying the second calibration data in order to separate into second measurement data of individual slices the measurement data captured in collapsed form that was acquired using readout gradients of the second polarity;

storing and/or processing further the first measurement data of individual slices and the second measurement data of individual slices, in each case for at least one individual slice of the at least two slices for which measurement data was acquired simultaneously in collapsed form.

By said determining of separate first calibration data from reference measurement data acquired by means of a GRE acquisition technique while switching readout gradients of a first polarity, and second calibration data from reference measurement data acquired by means of a GRE acquisition technique while switching readout gradients of a second polarity, which differs from the first polarity, it is possible to increase a quality of separation (unfolding) of measurement data acquired in collapsed form for a plurality of slices by means of SMS EPI into measurement data of the individual slices using the first and second calibration data (also called "convolution kernels"), and to reduce unfolding artifacts (such as increased noise or ghost images, for example). In particular, when dynamic interference fields (e.g., caused by eddy currents induced during gradient switching) have different impacts on measurement data to be separated for an imaging, which data was acquired using positive and negative readout gradients, the acquisition according to the disclosure of a set of reference measurement data while switching readout gradients of a different polarity in each case can increase consistency of the reference measurement data with the measurement data to be separated, and makes it possible to determine calibration data specific to each polarity of the readout gradients.

Compared with reference measurement data acquired by a single-shot EPI acquisition technique, the reference measurement data in the herein-described first and second sets of reference measurement data is insensitive to inhomogeneities in the main magnetic field B0 and can be acquired in a considerably shorter measurement time.

Compared with reference measurement data acquired by a multi-shot EPI acquisition technique, the reference measurement data in the herein-described first and second sets of reference measurement data is also insensitive to inhomogeneities in the main magnetic field B0, can be acquired in a considerably shorter measurement time, and is less sensitive to effects of (physiological) movements. The last-mentioned advantage is less marked when a multi-shot EPI acquisition technique is used together with a FLEET technique. Still, the reference measurement data in the herein-described first and second sets of reference measurement data is not affected by contrast variations, unlike reference measurement data acquired by means of a FLEET technique.

Compared with conventional GRE reference measurement data, the reference measurement data in the herein-described first and second sets of reference measurement data achieves a higher consistency with the measurement data to be separated because reference measurement data is acquired for both polarities of the readout gradients used in the acquisition of the measurement data to be separated.

A magnetic resonance system, according to the disclosure, comprises a magnet unit, a gradient unit, a radiofrequency unit, and a control device designed to implement a method according to the disclosure and comprising a reference measurement data unit.

A computer program, according to the disclosure, implements a method according to the disclosure in a control device when it is executed in the control device. For example, the computer program comprises commands which, on execution of the program by a control device, for instance a control device of a magnetic resonance system, cause this control device to perform a method according to the disclosure. The control device can be in the form of a computer.

The computer program can also be in the form of a computer program product, which can be loaded directly into a memory of a control device and which comprises program code means in order to perform a method according to the disclosure when the computer program product is executed in a computing unit of the computing system.

A computer-readable storage medium, according to the disclosure, comprises commands which, on execution by a control device, for instance, a control device of a magnetic resonance system, cause this control device to perform a method according to the disclosure.

The computer-readable storage medium can be embodied as an electronically readable data storage medium which comprises electronically readable control information stored thereon that comprises at least one computer program according to the disclosure and is designed such that it performs a method according to the disclosure when the data storage medium is used in a control device of a magnetic resonance system.

The advantages and comments given with regard to the method apply analogously also to the magnetic resonance system, to the computer program product and to the electronically readable data storage medium.

BRIEF DESCRIPTION OF THE DRAWINGS

Further advantages and details of the present disclosure are presented in the exemplary aspects described below and with reference to the drawings, where the examples given have no limiting effect on the disclosure, in which drawings.

DETAILED DESCRIPTION

Figure 1:
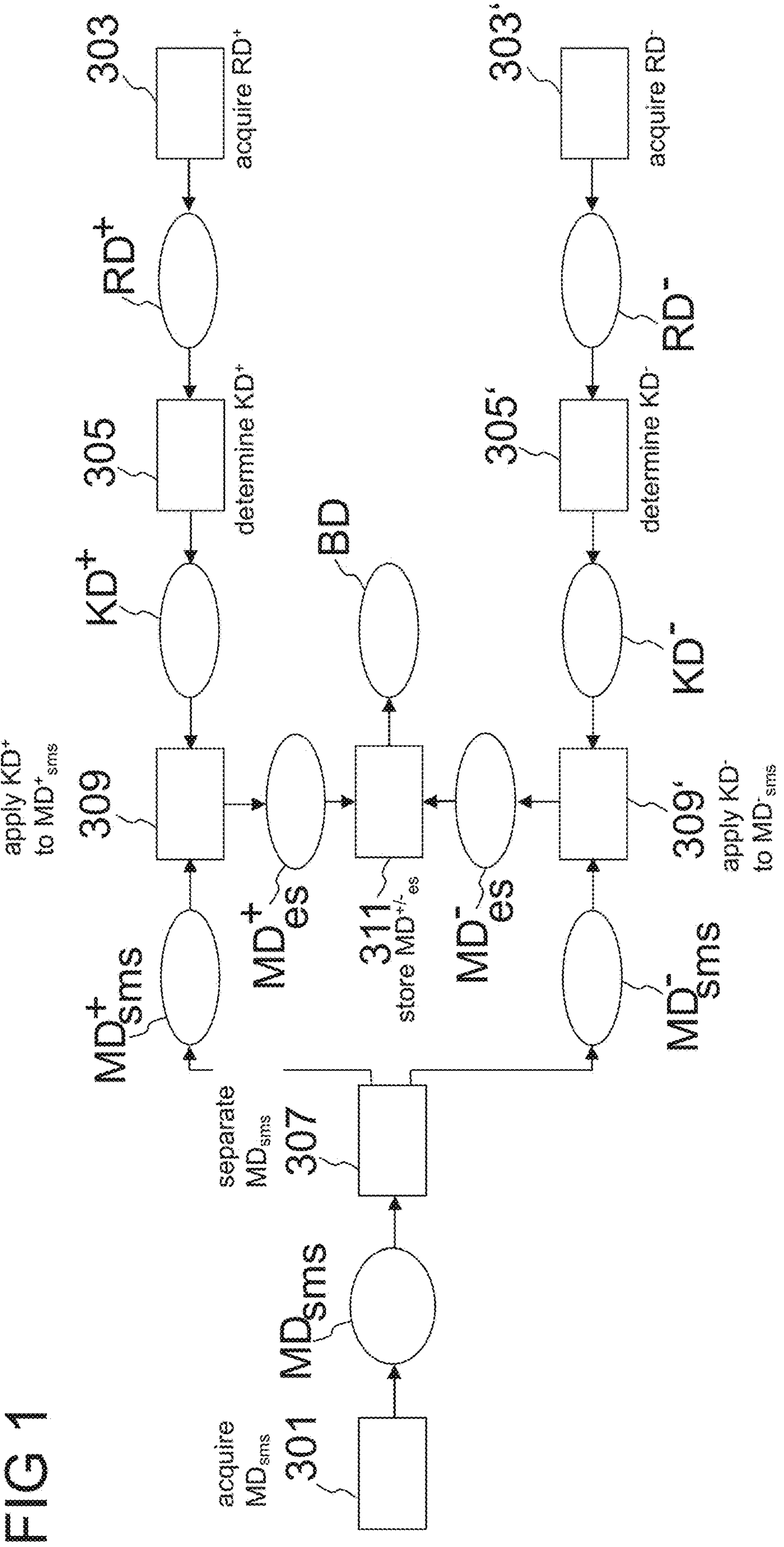
FIG. 1 is a schematic flow diagram of a method according to the disclosure.

FIG. 1 is a schematic flow diagram of a method according to the disclosure for separating measurement data $MD_{sms}$ of an object under examination, which data was acquired in collapsed form simultaneously for at least two slices by means of an echo planar (EPI) simultaneous multi-slice (SMS) technique, into measurement data of individual slices $MD^{+}_{es}$, $MD^{-}_{es}$.

In the method, measurement data $MD_{sms}$ to be separated is loaded, which measurement data was generated by generating a train of at least two echo signals from at least two different slices of an object under examination after one RF excitation pulse, and acquiring the echo signals while switching readout gradients A of alternating polarity for consecutive echo signals. The echo signals simultaneously acquired for the at least two slices were captured as measurement data $MD_{sms}$, for instance in a measurement dataset (block 301). Acquiring echo signals from at least two slices can be understood here to mean analogously also acquiring echo signals from at least two slabs (with three-dimensional spatial encoding).

Figure 2:
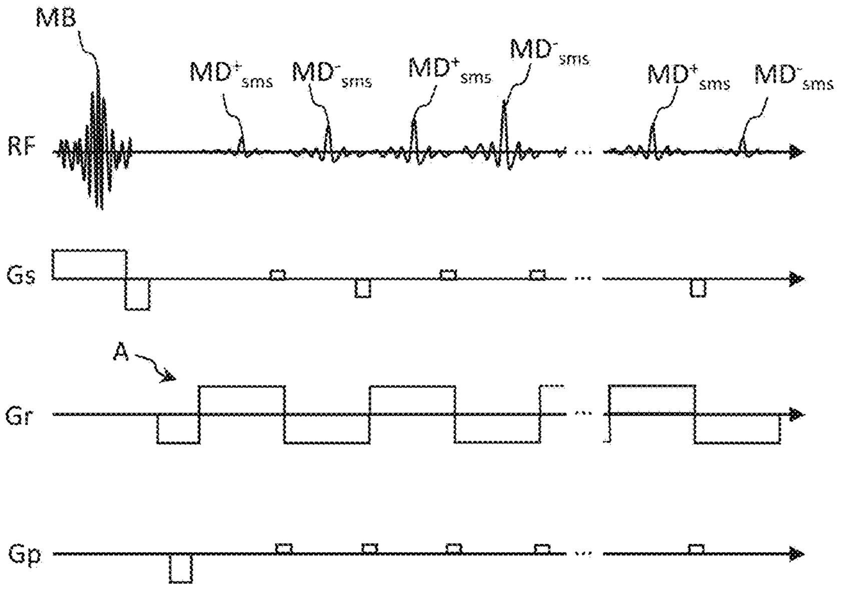
FIG. 2 shows a segment of a pulse sequence scheme for acquiring measurement data for imaging by means of an EPI SMS technique.

FIG. 2 shows a possible pulse sequence scheme for acquiring such measurement data for imaging by means of an EPI SMS technique. The top line RF shows RF pulses to be applied and generated echo signals, the second line Gs shows gradients to be switched in the slice-selection direction, the third line Gr shows gradients to be switched in the readout direction, and the bottom line Gp shows gradients to be switched in the phase-encoding direction.

After an RF excitation pulse MB, which, in particular, can be a multiband RF excitation pulse and which excites the at least two slices (i.e., SMS factor ≥2), a train of echo signals is generated from the at least two excited slices by a readout gradient A of alternating polarity (as is usual in EPI techniques), which echo signals are acquired and captured as measurement data $MD^{+}_{sms}$, $MD^{-}_{sms}$. As a result of the alternating polarity of the readout gradients A, in the example shown, measurement data $MD^{+}_{sms}$ is captured with a positive polarity of the readout gradient, and measurement data $MD^{-}_{sms}$ with a negative polarity of the readout gradient. The problems resulting from this have already been described above in the text.

FIG. 2 shows, by way of example, a pulse sequence scheme for imaging by means of single-shot gradient echo EPI. This shall not be interpreted restrictively; the method described herein is suitable for any EPI acquisition techniques, in particular also for multi-shot EPI acquisition techniques, spin echo EPI acquisition techniques, dual-spin-echo EPI acquisition techniques, stimulated echo EPI acquisition techniques, gradient echo EPI acquisition techniques, or GRASE (gradient and spin echo) EPI acquisition techniques.

For each of the at least two slices, a first set of reference measurement data $RD^{+}$ for separating the measurement data $MD_{sms}$ (block 303) is acquired by means of a GRE acquisition technique, wherein the reference measurement data $RD^{+}$ in the first set of reference measurement data $RD^{+}$ is acquired after a plurality of excitations having different phase encoding and in each case during switching of identically shaped readout gradients, which have a first polarity. The first polarity can be positive or negative here.

For each of the at least two slices, a second set of reference measurement data $RD^{-}$ for separating the measurement data $MD_{sms}$ (block 303') is acquired by means of a GRE acquisition technique, wherein the reference measurement data $RD^{-}$ in the second set of reference measurement data $RD^{-}$ is acquired after a plurality of excitations having different phase encoding and in each case during switching of identically shaped readout gradients, which have a second polarity, which differs from the first polarity.

Examples of possible pulse sequence schemes of GRE acquisition techniques for acquiring reference measurement data $RD^{+}$, $RD^{-}$ for a slice are described below in FIGS. 3 to 5, wherein in each figure again, the top line RF shows RF pulses to be applied and generated echo signals, the second line Gs shows gradients to be switched in the slice-selection direction, the third line Gr shows gradients to be switched in the readout direction, and the bottom line Gp shows gradients to be switched in the phase-encoding direction.

First calibration data $KD^{+}$ is determined on the basis of acquired first sets of reference measurement data $RD^{+}$ (block 305), and second calibration data $KD^{-}$ is determined on the basis of acquired second sets of reference measurement data $RD^{-}$ (block 305'). The first calibration data and second calibration data are determined in a manner known per se in the context of SMS techniques but, as described, are determined in each case on the basis of the respective acquired sets of reference measurement data.

In order to separate the measurement data $MD^{+}_{sms}$ captured in collapsed form and acquired using readout gradients of the first polarity into first measurement data of individual slices $MD^{+}_{es}$, the determined first calibration data $KD^{+}$ is applied to the measurement data $MD^{+}_{sms}$ to be separated that was captured in collapsed form and acquired using readout gradients of the first polarity (block 309).

In order to separate the measurement data $MD^{-}_{sms}$ captured in collapsed form and acquired using readout gradients of the second polarity into second measurement data of individual slices $MD^{-}_{es}$, the determined second calibration data $KD^{-}$ is applied to the measurement data $MD^{-}_{sms}$ to be separated that was captured in collapsed form and acquired using readout gradients of the second polarity (block 309').

For this purpose, the measurement data $MD_{sms}$ to be separated can be divided into measurement data $MD^{+}_{sms}$ captured in collapsed form and acquired using readout gradients of the first polarity and into measurement data $MD^{-}_{sms}$ captured in collapsed form and acquired using readout gradients of the second polarity (block 307).

It is conceivable that the measurement data $MD^{+-}$ was generated using a saturation technique, for instance, a fat saturation technique, and/or a spectrally selective excitation technique, for example, a water excitation technique, with the result that the acquired echo signals originate in a spectrally selective manner from a spin species, in particular from water spins, defined by the saturation technique and/or spectrally selective excitation technique. In particular, when the measurement data $MD^{+-}$ is generated in this spectrally selective manner, it is also possible to use a saturation technique and/or a spectrally selective excitation technique in the acquisition of the first and second sets of reference measurement data $RD^{+}$, $RD^{-}$, with the result that the acquired reference measurement data in the first and second sets of reference measurement data $RD^{+}$, $RD^{-}$ also originates in a spectrally selective manner from the same spin species as the echo signals from which the measurement data $MD^{+-}$ was generated. It is not necessary here that the same saturation technique or spectrally selective excitation technique is used in each case. However, rather it is still possible to achieve a further improvement in the consistency of the reference measurement data in the first and second sets of reference measurement data $RD^{+}$, $RD^{-}$ with the measurement data $MD^{+-}$ acquired for the imaging just by defining the same spin species albeit in different ways in the acquisitions of the reference measurement data and the echo signals of the measurement data $MD^{+-}$.

The first measurement data $MD^{+}_{es}$ of individual slices and the second measurement data $MD^{-}_{es}$ of individual slices are stored in each case for at least one of the at least two slices for which measurement data was acquired simultaneously in collapsed form and/or processed further, for instance, into image data BD (block 311).

Figure 3:
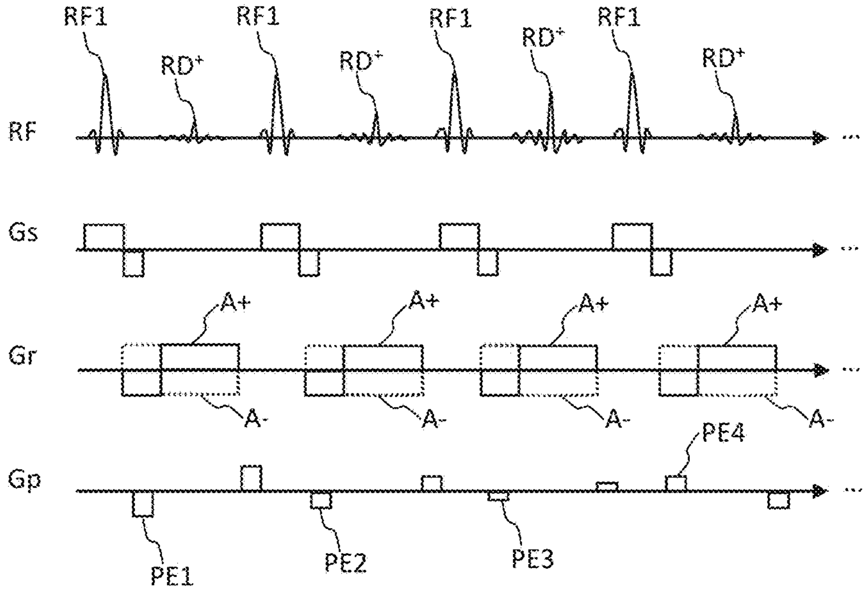
FIGS. 3-5 show segments of pulse sequence schemes for acquiring reference measurement data.

FIG. 3 shows a segment of a pulse sequence scheme for acquiring reference measurement data by means of a GRE acquisition technique. In this case, after each RF excitation pulse RF1 an echo signal can be generated from a slice of the object under examination, which is acquired with each switching of a readout gradient A+ as reference measurement data $RD^{+}$ along a k-space row, wherein the generated echo signals are encoded spatially with different phase encodings by switching different gradients in the phase-encoding direction PE1, PE2, PE3, PE4, with the result that the reference measurement data $RD^+$ is acquired along k-space rows that are shifted with respect to each other in the phase-encoding direction. The number of excitations, each by means of an RF excitation pulse RF1, and the different phase encodings PE1, PE2, PE3, PE4 can be selected such that a desired set of reference measurement data $RD^+$ is acquired in total.

The performed measurements are repeated using readout gradients A− in a readout direction (shown dotted) of different polarity from the polarity of the readout gradients A+, but otherwise having identical gradients and RF excitations pulses, thereby acquiring a set of reference measurement data $RD^-$ (not shown).

Thus, in a first measurement for acquiring a first set of reference measurement data, only reference measurement data $RD^+$ having a first, for instance, positive, polarity of the readout gradients used can be acquired, and in a second (separate) measurement for acquiring a second set of reference measurement data only reference measurement data $RD^-$ having a second, for instance negative, polarity of the readout gradients used can be acquired. It can thereby be achieved that both sets of reference measurement data (and all the acquired reference measurement data $RD^+$ and $RD^-$) have an identical echo time TE. Both measurements mentioned here can be acquired consecutively or else in an interleaved manner.

Figure 4:
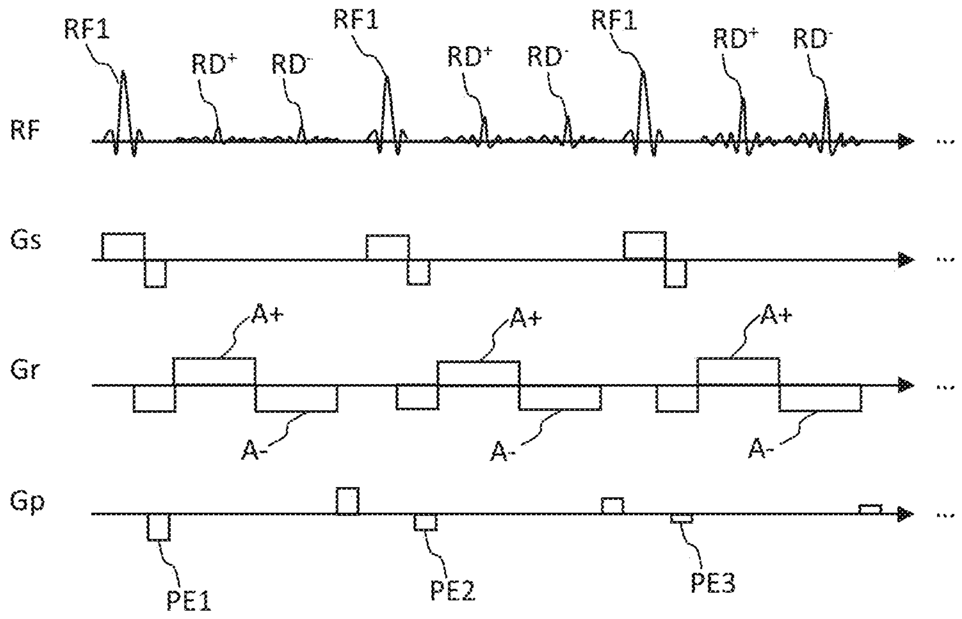

FIG. 4 shows a segment of a pulse sequence scheme for acquiring reference measurement data by means of a dual-echo GRE acquisition technique, in which two echo signals are generated by alternating readout gradients after an RF excitation pulse RF1. In this case, an echo signal generated first after each RF excitation pulse RF1 can be acquired with each switching of a first readout gradient A+ of a first polarity as reference measurement data $RD^+$ in a first direction along a k-space row and a second echo signal generated each time can be acquired with each switching of a second readout gradient A− of a second polarity, which differs from the first polarity, as reference measurement data $RD^-$ in a second direction along the same k-space row. The generated first and second echo signals can again, in this case, be spatially encoded with different phase encodings by switching different gradients in the phase-encoding direction PE1, PE2, PE3, with the result that the reference measurement data $RD^+$ and $RD^-$ is acquired along k-space rows that are shifted with respect to each other in the phase-encoding direction. The number of excitations, each by an RF excitation pulse RF1, and the different phase encodings PE1, PE2, PE3 can again be selected such that a desired first set of reference measurement data $RD^+$ and a desired second set of reference measurement data $RD^-$ is acquired in total.

Reference measurement data $RD^+$, $RD^-$ in the first set of reference measurement data $RD^+$ and in the second set of reference measurement data $RD^-$ can thus be acquired with the same phase encoding after joint excitation during two immediately consecutive readout gradients of the first polarity and the second polarity.

An acquisition of both sets of reference measurement data in this way by means of a dual-echo GRE acquisition technique can be performed in a shorter time than an acquisition of both sets of reference measurement data in accordance with a pulse sequence scheme shown in FIG. 3 because the acquisition of the reference measurement data $RD^-$ in the second set of reference measurement data $RD^-$ is performed without separate excitation immediately after acquisition of reference measurement data $RD^+$ in the first set of reference measurement data $RD^+$ by adding a further readout gradient A− after each excitation by an RF excitation pulse RF1. Reference measurement data $RD^+$ in the first set of reference measurement data $RD^+$ and reference measurement data $RD^-$ in the second set of reference measurement data $RD^-$ that are acquired in this way have different echo times TE, however.

Figure 5:
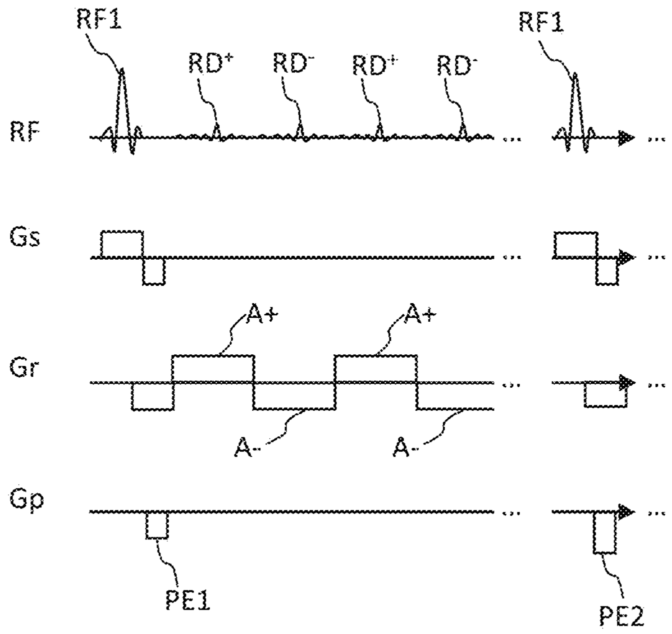

FIG. 5 shows a segment of a pulse sequence scheme for acquiring reference measurement data $RD^+$, $RD^-$ by means of a multiple-echo GRE acquisition technique, in which a plurality of echo signals, for instance, three, four, five, or more, are generated by alternating readout gradients A+, A− after an RF excitation pulse RF1. In this case, an echo signal generated first after each RF excitation pulse RF1, and each additional odd-numbered generated echo signal, can be acquired with each switching of a first readout gradient A+ of a first polarity as reference measurement data $RD^+$ in a first direction along a k-space row. A second echo signal is generated each time, and each additional even-numbered generated echo signal can be acquired with each switching of a second readout gradient A− of a second polarity, which differs from the first polarity, as reference measurement data $RD^-$ in a second direction along the same k-space row. The generated first and second echo signals can again, in this case, be spatially encoded with different phase encodings by switching different gradients in the phase-encoding direction PE1, PE2, with the result that the reference measurement data $RD^+$ and $RD^-$ is acquired along k-space rows that are shifted with respect to each other in the phase-encoding direction. The number of excitations, each by means of an RF excitation pulse RF1, and the different phase encodings PE1, PE2 can again be selected such that a desired first set of reference measurement data $RD^+$ and a desired second set of reference measurement data $RD^-$ is acquired in total.

Reference measurement data $RD^+$, $RD^-$ in the first set of reference measurement data $RD^+$ and in the second set of reference measurement data $RD^-$ can thus be acquired with the same phase encoding after joint excitation during at least three immediately consecutive readout gradients of the first polarity and the second polarity, and acquired multiple times at least for one of the two sets of reference measurement data $RD^+$, $RD^-$.

It is hence conceivable that reference measurement data $RD^+$, $RD^-$ in the first set of reference measurement data $RD^+$ and/or in the second set of reference measurement data $RD^-$ is acquired at least twice with an identical polarity with the same phase encoding after a joint excitation, with the result that at least two sets of reference measurement data $RD^+$, $RD^-$ of the same type (same polarity and same spatial encoding, e.g. the same k-space row) are acquired.

Acquiring the two sets of reference measurement data in this way by means of a multiple-echo GRE acquisition technique requires (as in the example of the dual-echo GRE acquisition technique described with reference to FIG. 4) fewer excitations to acquire the two sets of reference measurement data than an acquisition of the two sets of reference measurement data in a manner described with reference to FIG. 3. Furthermore, acquiring the two sets of reference measurement data in this way by means of a multiple-echo GRE acquisition technique allows additional freedoms:

If the two sets of reference measurement data are acquired using a three-echo GRE acquisition technique, for example, in which three echo signals are generated, and each time the echo signal that is generated third is acquired with a readout gradient of the same polarity as the echo signal generated first, then the two sets of reference measurement data of the same type, which were acquired by acquiring reference measurement data during the echo signals generated first and third, can be combined into a combined set of reference measurement data so that a better consistency of the reference measurement data can be achieved. Said combining of sets of reference measurement data of the same type can be performed in particular as part of the determining of associated calibration data (block 305 or 305'), or before the calibration data is determined.

The two sets of reference measurement data of the same type can be combined, in particular by averaging (e.g., in a similar way to that described in the above-cited U.S. Pat. No. 6,043,651 for navigator data), in such a way that the combined set of reference measurement data has a virtual echo time TE that effectively equals the echo time TE of the reference measurement data acquired during the second echo signal.

Thus, at least two sets of reference measurement data of the same type can be combined in such a way that at least one combined set of reference measurement data has a virtual echo time that effectively equals an echo time of a set of reference measurement data that was acquired using readout gradients of a different polarity than the reference measurement data in the combined sets of reference measurement data. This can achieve an even better consistency of the reference measurement data.

Alternatively, the echo signal always generated first in a three-echo GRE acquisition technique can be ignored, and only the echo signals generated second and third in each case are acquired as reference measurement data $RD^+$, $RD^-$ (rather like in a dual-echo GRE acquisition). In this manner it can be achieved that the echo signals used to acquire the sets of reference measurement data $RD^+$, $RD^-$ are “more similar” to most of the echo signals in the echo train that were acquired as measurement data $MD_{sms}$. This is particularly the case if transient processes generate effects during the acquisition of the measurement data $MD_{sms}$ to be separated, which cause changes in the acquired measurement data, especially changes in the signal phases, across the acquired EPI echo train. Such a situation can be caused, for example, by resonance effects of the gradient unit of the magnetic resonance system being used. In addition, the gradients switched before a first echo signal of a three-echo GRE acquisition technique (e.g., for slice selection, phase encoding, and/or prephasing of the readout gradients) can generate interference or eddy currents. Therefore, first echo signals are affected differently or more severely than other echo signals generated later after the joint excitation, whereby first echo signals could be deemed particularly “unrepresentative” of the majority of the echo signals in the EPI echo train that was used to acquire the measurement data $MD_{sms}$ to be separated.

If at least two sets of reference measurement data of the same type have been acquired, it is also possible to discard the set of reference measurement data of the at least two sets of reference measurement data of the same type that was acquired first in time. This can achieve similar advantages to the case described above in which echo signals generated first after an excitation are ignored.

Adding another one or more echo signals by additional alternating readout gradients after a joint excitation pulse RF1 results in four-echo or five-echo GRE acquisition techniques (etc.).

It is also possible for such multiple-echo GRE acquisition techniques, similar to the options described with reference to the three-echo GRE acquisition, to acquire or take into account reference measurement data either from just individual echo signals (e.g., the last two in each case) after a joint excitation and/or if at least two sets of reference measurement data of the same type have been acquired, to combine these into a combined set of reference measurement data.

For example, in the case of a four-echo GRE acquisition technique, a first echo signal after each excitation could be ignored, and sets of reference measurement data of the same type acquired during a second and fourth echo signal, respectively, could be averaged to form a combined set of reference measurement data. Reference measurement data in such a combined set of reference measurement data can (as described above) have a virtual echo time TE that effectively equals an echo time TE of the reference measurement data of a second set of reference measurement data that was acquired during the third echo signal after the joint excitation. First calibration data can then be determined on the basis of the reference measurement data in the combined set of reference measurement data for a first polarity, and second calibration data can then be determined on the basis of the reference measurement data (having effectively identical echo time TE) in the second set of reference measurement data for a second polarity.

By ignoring first echo signals, the acquired reference measurement data is more representative of the echo signals in an EPI echo train that was used to acquire the measurement data $MD_{sms}$ to be separated.

In the simplest case, properties, apart from the specified polarity, of readout gradients used for acquiring the reference measurement data for the two sets of reference measurement data (in particular properties such as duration of constant amplitude, amplitude, ramp times or rise and fall slew rates) can be selected independently of the alternating readout gradients of the SMS EPI technique that was used to acquire the measurement data $MD_{sms}$ to be separated. This gives maximum flexibility in the parameterization of the reference measurement data, and this data can be acquired, for example, with a reduced resolution and hence very quickly in a short measurement time.

In general, in order to improve the consistency between the measurement data $MD_{sms}$ to be separated and the acquired reference measurement data, readout gradients used in the acquisition of the first set of reference measurement data and of the second set of reference measurement data can be selected such that they are as similar as possible, in particular identical, to the readout gradients that were used in the capture of the measurement data $MD_{sms}$ to be separated in at least one of the parameters from the group comprising size of amplitude, rise slew rate, duration of constant amplitude, fall slew rate, readout bandwidth, resolution in the readout direction, positioning relative to the readout gradient of an acquisition window that is used (e.g. for what is known as ramp sampling, in which acquisition of the (reference) measurement data is started already during the rising edge of the readout gradient), symmetry of the echo (e.g. in connection with partial Fourier techniques in the readout direction).

The more similar the properties of the readout gradients used in the acquisition of the reference measurement data are chosen to be to the properties of the readout gradients of the SMS EPI technique that was used to acquire the measurement data $MD_{sms}$ to be separated or the more of these properties that are selected to be as similar as possible, the more the achievable consistency can be improved between the acquired reference measurement data and the measurement data $MD_{sms}$ to be separated. For maximum consistency, the parameters and, hence, properties of the readout gradients for the acquisitions of the reference measurement data can be chosen to be completely identical to those of the SMS EPI technique that was used to acquire the measurement data $MD_{sms}$ to be separated.

When identical properties of the readout gradients of the reference measurement data to those of the measurement data $MD_{sms}$ to be separated are used, preprocessing steps such as correction methods, for instance, that are applied to the measurement data $MD_{sms}$ to be separated can be applied in an identical manner to the reference measurement data $RD^+$, $RD^-$. Examples of preprocessing steps that are eligible here are corrections of a variable sampling density in the case of ramp sampling and/or corrections of asymmetries between positive and negative readout gradients (for instance, based on navigator data), as already mentioned above.

Thus preprocessing steps, in particular correction methods, that are applied to the measurement data $MD_{sms}$ to be separated before the first and/or second calibration data is applied to the corresponding captured measurement data (e.g. in block 307) can be applied analogously also before the determining of the first and second calibration data $KD^+$, $KD^-$ (block 305 and block 305' respectively) to the first set of reference measurement data $RD^+$ and/or to the second set of reference measurement data $RD^-$.

A phase correction method can be applied to the first set of reference measurement data $RD^+$ and/or to the second set of reference measurement data $RD^-$ in order to align the phase evolution of the reference measurement data $RD^+$, $RD^-$ in the sets of reference measurement data $RD^+$, $RD^-$ to those of the measurement data $MD_{sms}$ to be separated. Such phase correction methods can be used to reduce variations in the phase evolution of the reference measurement data $RD^+$, $RD^-$ (acquired using a gradient echo measurement and short echo time) and in the phase evolution of the measurement data $MD_{sms}$ to be separated that was acquired by means of the SMS EPI technique for imaging (acquired using an EPI measurement and longer echo time) when the spatial distribution of the main magnetic field B0 is known. DE 10 2016 200889 B4 describes such a phase correction method, for example. A further improvement in the consistency of reference measurement data and measurement data $MD_{sms}$ to be separated associated with such a phase correction method can lead to even better quality of the results of the separation into measurement data of individual slices.

It is conceivable that the captured measurement data $MD_{sms}$ to be separated is acquired in-plane incompletely in accordance with a parallel acquisition technique such as GRAPPA, and the first set of reference measurement data $RD^+$ and the second set of reference measurement data $RD^-$ are used additionally as reference measurement data as part of the parallel acquisition technique to complete the data that was not acquired because acquired reference measurement data in the first and second sets of reference measurement data $RD^+$, $RD^-$ is inherently suitable for such an application as part of parallel acquisition techniques. Acquiring further reference measurement data specifically for the parallel acquisition technique can be omitted.

The captured measurement data $MD_{sms}$ to be separated can also be processed by means of a dual-polarity GRAPPA (DPG) algorithm, as described, for example, in the article by Hoge et al., "Dual-polarity GRAPPA for simultaneous reconstruction and ghost correction of echo planar imaging data," Magn. Reason. Med. 76: pages 32-44, 2016. In this case, the first and second sets of reference measurement data can also be used as reference measurement data as part of the DPG algorithm. Acquiring further reference measurement data specifically for the DPG algorithm can be omitted.

Hence using the method described herein, in particular by determining polarity-specific calibration data, it is possible to significantly increase a consistency of measurement data $MD_{sms}$ to be separated with reference measurement data acquired to determine the calibration data (convolution kernels) despite different acquisition techniques in the acquisition of the reference measurement data and the measurement data $MD_{sms}$ to be separated (GRE vs. EPI), with the result that it is possible to separate (unfold) the signal contributions of the different slices with higher quality (lower noise and/or reduced unfolding artifacts).

Imaging methods in which the acquisition time for the measurement data $MD_{sms}$ to be separated is very short benefit, in particular from acquiring reference measurement data according to a method described herein in first and second sets of reference measurement data. The shorter this acquisition time, the more important is the time for the acquisition of the reference measurement data (in relative terms). For example, on typical clinical magnetic resonance systems, diffusion-weighted imaging of the entire head by means of single-shot EPI, for instance, (e.g. with an SMS factor of 2 and an (in-plane) GRAPPA factor of 2) within 4 repetitions (1× without diffusion weighting, 3× with diffusion weighting along orthogonal directions) with a repetition time TR of 3 seconds can be performed in a total of 4×3=12 seconds. If applicable, a further "dummy repetition" and, thus, a further repetition time TR for establishing a state of equilibrium of the magnetization can be required, resulting in a total of 5×3=15 seconds for the time length of the entire measurement. For a previously known acquisition of reference measurement data by means of an EPI acquisition technique for separating the measurement data acquired in collapsed form for (in this example) two slices, 3-6 seconds are needed in the known prior art. For a previously known acquisition of further reference measurement data by means of a GRE or an EPI acquisition technique for completing unacquired measurement data within a slice, a further 3-6 seconds are needed in the known prior art. In total, an acquisition of all the necessary reference measurement data thus takes 6-12 seconds in the prior art, and thus almost as long as the acquisition of the measurement data for the imaging. If GRE reference measurement data known from the prior art and acquired using just one polarity of the readout gradients is used both for separating the slices acquired in collapsed form and for completing the unacquired measurement data within a slice, the time needed for acquiring the reference measurement data can be reduced to 3-6 seconds, but an achievable quality for the separation of the slices acquired in collapsed form (slice unfolding) suffers under such a choice of reference measurement data.

Using a method according to the disclosure, an acquisition of the reference measurement data in both sets of reference measurement data is possible in 4-7 seconds, which represents an only insignificant increase compared with previously known acquisitions of reference measurement data by means of a GRE acquisition technique using only one polarity of the readout gradients used, while achieving a considerably higher quality for the slice unfolding.

The aspects of the disclosure succeed in combining the advantages of reference measurement data acquired by means of a GRE acquisition technique (e.g., short measurement times, low sensitivity to movement) with the advantages of reference measurement data acquired by means of an EPI acquisition technique (in particular improved consistency with the measurement data $MD_{sms}$ to be separated), and thus in achieving improved quality of the slice unfolding and hence of the reconstructible individual images after the slice unfolding.

In addition, the reference measurement data acquired according to the disclosure can also be used as part of parallel acquisition techniques for compensation for in-plane undersampling (e.g., with GRAPPA), are robust to movements of the object under examination, insensitive to inhomogeneities in the main magnetic field B0, and allow a high degree of flexibility in the choice of the parameters of the acquisition, in particular of the resolution.

Figure 6:
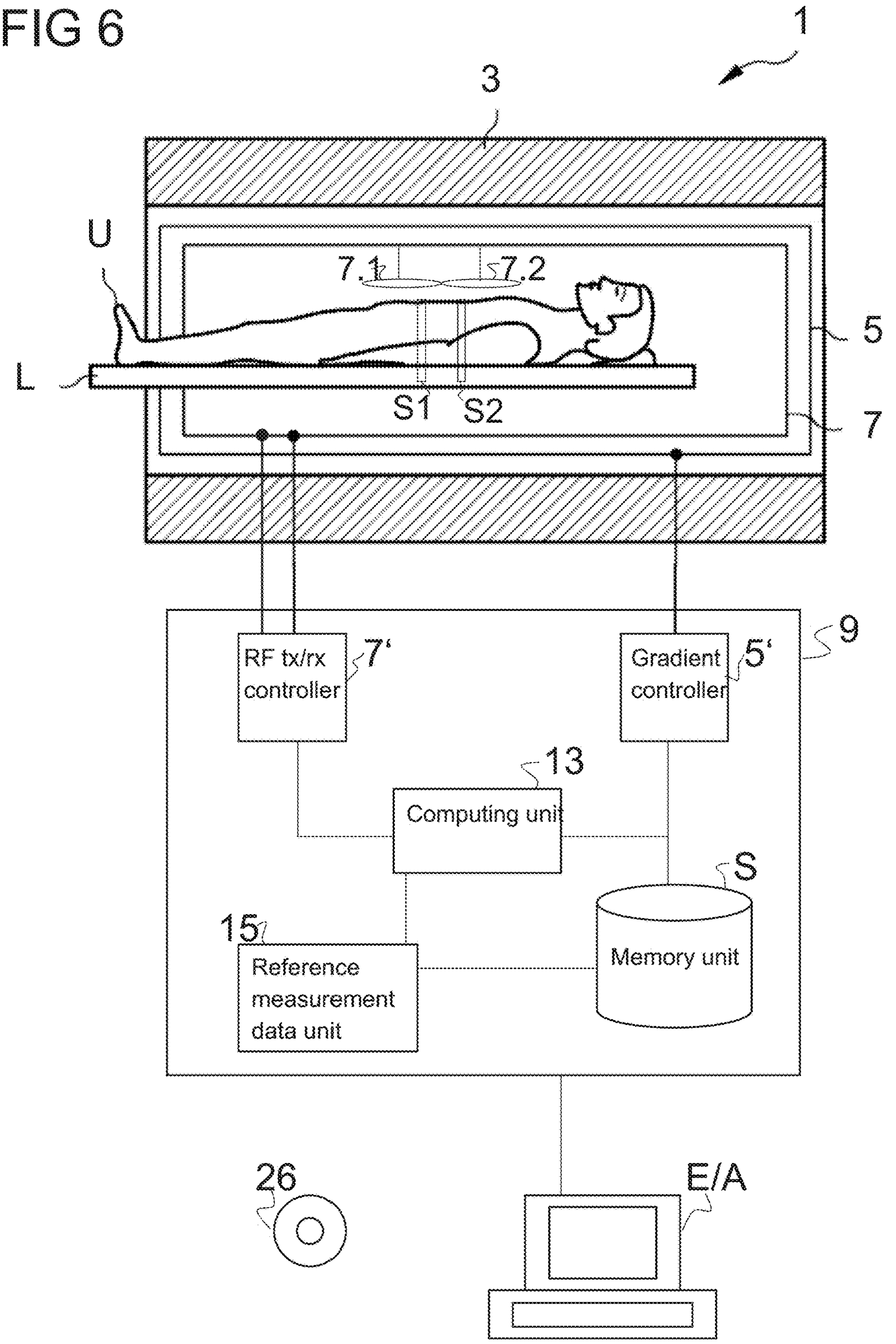
FIG. 6 shows a schematic representation of a magnetic resonance system according to the disclosure.

FIG. 6 shows schematically a magnetic resonance system 1 according to the disclosure. This comprises a magnet unit 3 for generating the main magnetic field, a gradient unit 5 for generating the gradient fields, a radiofrequency unit 7 for emitting and receiving radiofrequency signals, and a control device 9 designed to implement a method according to the disclosure.

In FIG. 6, these sub-units of the magnetic resonance system 1 are not shown in detail. In particular, the radiofrequency unit 7 may consist of a plurality of sub-units, for instance, of a plurality of coils such as the coils 7.1 and 7.2 shown schematically or more coils, which may either be designed solely to transmit radiofrequency signals or solely to receive the induced radiofrequency signals, or be designed to do both.

In order to examine an object under examination U, for example, a patient or else a phantom, the object can be introduced into the magnetic resonance system 1 into the measurement volume thereof on a couch L. The schematically depicted slices S1 and S2 represent by way of example a plurality of slices of a target volume of the object under examination, which slices are to be acquired simultaneously by means of a slice multiplexing method, from which echo signals can be acquired in collapsed form and captured as measurement data.

The control device 9 is used to control the magnetic resonance system 1 and, in particular, can control the gradient unit 5 by means of a gradient controller 5' and can control the radiofrequency unit 7 by means of a radiofrequency transmit/receive controller 7'. The radiofrequency unit 7 can here comprise a plurality of channels on which signals can be transmitted or received.

The radiofrequency unit 7, together with its radiofrequency transmit/receive controller 7' is responsible for generating and radiating (transmitting) an alternating radiofrequency field for manipulating the spins in a region to be manipulated (for instance in slices S to be measured) of the object under examination U. The center frequency of said alternating radiofrequency field, also referred to as the B1 field, as a rule is set so as to lie close to the resonant frequency of the spins to be manipulated. Off-resonance refers to deviations of the resonant frequency from the center frequency. In order to generate the B1 field, currents are applied to the RF coils, which currents are controlled in the radiofrequency unit 7 by means of the radiofrequency transmit/receive controller 7'.

In addition, the control device 9 comprises a reference measurement data unit 15, which can be used to control an acquisition according to the disclosure of reference measurement data. The control device 9 is designed overall to perform a method according to the disclosure.

A computing unit 13 comprised of the control device 9 is designed to perform all the computing operations needed for the required measurements and determinations. Intermediate results and results required for this purpose or determined in this process can be saved in a memory unit S of the control device 9. The units shown need not necessarily be interpreted here as physically separate units but merely constitute a subdivision into logical units, which, however, can be implemented, e.g., in fewer physical units or even in just one physical unit.

Via an input/output device E/A of the magnetic resonance system 1, it is possible, for instance, for a user to direct control commands to the magnetic resonance system and/or to display results from the control device 9, for example, results such as image data.

A method described herein can also exist in the form of a computer program, which comprises commands that execute the described method in a control device 9. A computer-readable storage medium can likewise be provided that comprises commands which, on execution by a control device 9 of a magnetic resonance system 1, cause said device to execute the described method.

Independent of the grammatical term usage, individuals with male, female, or other gender identities are included within the term.

The invention claimed is:

1. A method for separating measurement data of an object under examination acquired in collapsed form simultaneously for at least two slices, using an echo planar (EPI) simultaneous multi-slice (SMS) technique, into measurement data of individual slices, the method comprising:

loading measurement data to be separated which was generated by generating a train of at least two echo signals from at least two different slices of the object under examination after one radio frequency (RF) excitation pulse, and by acquiring the echo signals while switching readout gradients of alternating polarity for consecutive echo signals, and by capturing as the measurement data the echo signals acquired simultaneously for the at least two slices;

for each of the at least two slices, acquiring using a gradient echo (GRE) acquisition technique a first set of reference measurement data for separating the measurement data, wherein reference measurement data in the first set of reference measurement data is acquired after a plurality of excitations having different phase encoding and in each case during switching of identically shaped readout gradients of a first polarity;

for each of the at least two slices, acquiring using a GRE acquisition technique a second set of reference measurement data for separating the measurement data, wherein reference measurement data in the second set of reference measurement data is acquired after a plurality of excitations having different phase encoding and in each case during switching of identically shaped readout gradients of a second polarity, which differs from the first polarity;

determining first calibration data based on acquired first sets of reference measurement data;

determining second calibration data based on acquired second sets of reference measurement data;

applying the first calibration data in order to separate into first measurement data of individual slices the measurement data captured in collapsed form that was acquired using readout gradients of the first polarity;

applying the second calibration data in order to separate into second measurement data of individual slices the measurement data captured in collapsed form that was acquired using readout gradients of the second polarity; and storing and/or processing further the first measurement data of individual slices and the second measurement data of individual slices, in each case for at least one individual slice of the at least two slices for which measurement data was acquired simultaneously in collapsed form.

2. The method as claimed in claim 1, wherein reference measurement data in the first set of reference measurement data and in the second set of reference measurement data is acquired with the same phase encoding after joint excitation during two immediately consecutive readout gradients of the first polarity and the second polarity.

3. The method as claimed in claim 1, wherein the readout gradients used in the acquisition of the first set of reference measurement data and of the second set of reference measurement data are selected such that they are as similar as possible to the readout gradients that were used in the capture of the measurement data in at least one parameter from a group of parameters consisting of size of amplitude, rise slew rate, duration, fall slew rate, readout bandwidth, resolution in a readout direction, positioning relative to the readout gradient of an acquisition window that is used, and symmetry of the echo.

4. The method as claimed in claim 1, wherein preprocessing steps that are applied to the measurement data to be separated before the first and/or second calibration data is applied to the measurement data to be separated, are applied analogously also before the determining of the first and second calibration data to the first set of reference measurement data and/or to the second set of reference measurement data.

5. The method as claimed in claim 1, wherein the measurement data to be separated was acquired in-plane incompletely in accordance with a parallel acquisition technique, and the first set of reference measurement data and the second set of reference measurement data are used as reference measurement data as part of the parallel acquisition technique to complete the data that was not acquired.

6. The method as claimed in claim 1, wherein the measurement data to be separated is processed using a dual-polarity GRAPPA (DPG) algorithm, and the first and second sets of reference measurement data are also used as reference measurement data as part of the DPG algorithm.

7. The method as claimed in claim 1, wherein a phase correction method is applied to the first set of reference measurement data and/or to the second set of reference measurement data in order to align a phase evolution of the reference measurement data in the sets of reference measurement data to those of the measurement data to be separated.

8. The method as claimed in claim 1, wherein the measurement data to be separated is acquired using an acquisition technique from a group of acquisition techniques consisting of multi-shot EPI, spin echo EPI, dual-spin-echo EPI, stimulated echo EPI, gradient echo EPI, and GRASE (gradient and spin echo) EPI.

9. The method as claimed in claim 1, wherein the measurement data was generated using a saturation technique and/or a spectrally selective excitation technique, with a result that the acquired echo signals originate in a spectrally selective manner from a spin species defined by the saturation technique and/or spectrally selective excitation technique, and a saturation technique and/or a spectrally selective excitation technique is likewise used in the acquisition of the first and second sets of reference measurement data, with a result that the acquired reference measurement data in the first and second sets of reference measurement data also originates in a spectrally selective manner from the same spin species as the echo signals from which the measurement data was generated.

10. A magnetic resonance system, comprising:

a magnet unit;

a gradient unit;

a radiofrequency unit; and a control device having a radiofrequency transmit/receive controller and a reference measurement data unit, wherein the control device is designed to perform on the magnetic resonance system a method as claimed in claim 1.

11. A non-transitory computer-readable storage medium comprising commands which, when executed by a control device of a magnetic resonance system, cause the magnetic resonance system to perform the method as claimed in claim 1.

12. The method as claimed in claim 2, wherein reference measurement data in the first set of reference measurement data and/or in the second set of reference measurement data is acquired at least twice with an identical polarity with a same phase encoding after a joint excitation, with a result that at least two sets of reference measurement data of a same type are acquired.

13. The method as claimed in claim 12, wherein at least two sets of reference measurement data of the same type are combined into a combined set of reference measurement data.

14. The method as claimed in claim 12, wherein, if at least two sets of reference measurement data of the same type have been acquired, the set of reference measurement data of the at least two sets of reference measurement data of the same type that was acquired first in time is discarded.

15. The method as claimed in claim 13, wherein the at least two sets of reference measurement data of the same type are combined such that at least one combined set of reference measurement data has a virtual echo time that effectively equals an echo time of a set of reference measurement data that was acquired using readout gradients of a different polarity than the reference measurement data in the combined sets of reference measurement data.

* * * * *